United States Patent
Kurokawa

(10) Patent No.: US 10,418,995 B2
(45) Date of Patent: Sep. 17, 2019

(54) RECONFIGURABLE CIRCUIT, STORAGE DEVICE, AND ELECTRONIC DEVICE INCLUDING STORAGE DEVICE

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 14 days.

(21) Appl. No.: 15/361,538

(22) Filed: Nov. 28, 2016

(65) Prior Publication Data

US 2017/0077929 A1 Mar. 16, 2017

Related U.S. Application Data

(63) Continuation of application No. 14/526,720, filed on Oct. 29, 2014, now Pat. No. 9,515,656.

(30) Foreign Application Priority Data

Nov. 1, 2013 (JP) ................................ 2013-228081

(51) Int. Cl.
*H03K 19/003* (2006.01)
*H03K 19/177* (2006.01)
(Continued)

(52) U.S. Cl.
CPC ....... *H03K 19/00392* (2013.01); *G11C 29/08* (2013.01); *H03K 19/0075* (2013.01); (Continued)

(58) Field of Classification Search
None
See application file for complete search history.

(56) References Cited

U.S. PATENT DOCUMENTS 5,953,246 A 9/1999 Takashima et al.
6,097,212 A * 8/2000 Agrawal ............ H03K 19/1737
326/38

(Continued)

FOREIGN PATENT DOCUMENTS

JP 05-142297 A 6/1993
JP 11-205125 A 7/1999
(Continued)

*Primary Examiner* — Crystal L Hammond
(74) *Attorney, Agent, or Firm* — Fish & Richardson P.C.

(57) ABSTRACT

A reconfigurable circuit suitable for a redundant circuit of a storage device is provided. A programmable logic element (PLE) includes k logic circuits (e.g., XNOR circuits), k configuration memories (CM), and another logic circuit (e.g., an AND circuit) to which the outputs of the k logic circuits are input. The output of the AND circuit represents whether k input data of the PLE all correspond to configuration data stored in the k CMs. For example, when the address of a defective block in the storage device is stored in the CM and address data of the storage device the access of which is requested is input to the PLE, whether the defective block is accessible can be determined from the output of the AND circuit.

13 Claims, 10 Drawing Sheets

(51) Int. Cl.
  *G11C 29/08* (2006.01)
  *H03K 19/173* (2006.01)
  *H03K 19/21* (2006.01)
  *H03K 19/0175* (2006.01)
  *H03K 19/20* (2006.01)
  *H03K 19/007* (2006.01)

(52) U.S. Cl.
  CPC . *H03K 19/017581* (2013.01); *H03K 19/1737* (2013.01); *H03K 19/1776* (2013.01); *H03K 19/17728* (2013.01); *H03K 19/20* (2013.01); *H03K 19/21* (2013.01)

(56) References Cited

U.S. PATENT DOCUMENTS

| | | | |
|---|---|---|---|
| 6,359,466 B1 * | 3/2002 | Sharpe-Geisler | G06F 7/5057 326/113 |
| 6,367,030 B1 | 4/2002 | Yamauchi | |
| 6,515,892 B1 | 2/2003 | Itoh et al. | |
| 6,762,951 B2 | 7/2004 | Itoh et al. | |
| 6,792,565 B1 | 9/2004 | Koyama | |
| 6,876,569 B2 | 4/2005 | Itoh et al. | |
| 6,980,026 B1 * | 12/2005 | Trimberger | H03K 19/17728 326/40 |
| 7,023,721 B2 | 4/2006 | Itoh et al. | |
| 7,286,380 B2 | 10/2007 | Hsu et al. | |
| 7,490,260 B2 | 2/2009 | Venkatraman et al. | |
| 7,502,977 B2 | 3/2009 | Venkatraman et al. | |
| 7,529,998 B2 | 5/2009 | Reblewski | |
| 7,598,769 B2 | 10/2009 | Leung | |
| 7,705,628 B1 * | 4/2010 | Hutton | H03K 19/1736 326/37 |
| 7,746,105 B1 * | 6/2010 | Gaide | H03K 19/17736 326/38 |
| 7,800,401 B1 * | 9/2010 | Lewis | H03K 19/177 326/38 |
| 8,103,919 B1 | 1/2012 | Kumar et al. | |
| 8,547,753 B2 | 10/2013 | Takemura et al. | |
| 8,675,382 B2 | 3/2014 | Kurokawa | |
| 8,760,193 B2 | 6/2014 | Voogel et al. | |
| 8,872,171 B2 | 10/2014 | Yamazaki et al. | |
| 2003/0122578 A1 * | 7/2003 | Masui | G06F 21/76 326/39 |
| 2004/0145942 A1 * | 7/2004 | Leijten-Nowak | H03K 19/1737 365/154 |
| 2005/0127944 A1 * | 6/2005 | Lewis | H03K 19/1737 326/41 |
| 2006/0081962 A1 * | 4/2006 | Wei | G11C 13/0007 257/537 |
| 2006/0097750 A1 | 5/2006 | Leijten-Nowak | |
| 2006/0158218 A1 * | 7/2006 | Leijten-Nowak | G06F 7/503 326/41 |
| 2012/0212995 A1 | 8/2012 | Kurokawa | |
| 2012/0274355 A1 * | 11/2012 | Nishijima | H03K 19/17728 326/41 |
| 2013/0207170 A1 | 8/2013 | Kurokawa | |
| 2013/0256762 A1 * | 10/2013 | Nishijima | H03K 19/17728 257/208 |
| 2013/0285697 A1 | 10/2013 | Kurokawa | |
| 2013/0286757 A1 | 10/2013 | Takemura | |
| 2013/0293262 A1 | 11/2013 | Takemura | |
| 2013/0314124 A1 | 11/2013 | Ikeda et al. | |
| 2013/0321025 A1 | 12/2013 | Kurokawa et al. | |
| 2014/0126271 A1 * | 5/2014 | Aoki | G11C 14/0072 365/149 |
| 2014/0225644 A1 * | 8/2014 | Aoki | H03K 19/017581 326/41 |
| 2015/0048363 A1 | 2/2015 | Yamazaki et al. | |

FOREIGN PATENT DOCUMENTS

| | | |
|---|---|---|
| JP | 11-249969 A | 9/1999 |
| JP | 2000-122935 A | 4/2000 |
| JP | 2005-532756 | 10/2005 |
| JP | 2007-194594 A | 8/2007 |
| JP | 2008-219883 A | 9/2008 |
| WO | WO-2000/062339 | 10/2000 |
| WO | WO-2004/008641 | 1/2004 |

* cited by examiner

RECONFIGURABLE CIRCUIT, STORAGE DEVICE, AND ELECTRONIC DEVICE INCLUDING STORAGE DEVICE

CROSS-REFERENCE TO RELATED APPLICATIONS

This application is a continuation of U.S. application Ser. No. 14/526,720, filed Oct. 29, 2014, now allowed, which claims the benefit of a foreign priority application filed in Japan as Serial No. 2013-228081 on Nov. 1, 2013, both of which are incorporated by reference.

BACKGROUND OF THE INVENTION

1. Field of the Invention

The present invention relates to an object, a method, or a manufacturing method. In addition, the present invention relates to a process, a machine, manufacture, or a composition of matter. For example, the present invention relates to a semiconductor device, a method for driving the semiconductor device, or a method for testing the semiconductor device. Specifically, the present invention relates to a reconfigurable circuit, a method for driving the reconfigurable circuit, a storage device, or a method for testing the storage device.

2. Description of the Related Art

To improve the manufacturing yield of a storage device such as a flash memory, a storage device in which a redundant memory cell is prepared and a redundant circuit for replacing a defective memory cell with the redundant memory cell is provided has been proposed. In addition, a storage device in which a specific test circuit is included to test a memory cell has been proposed.

For example, Patent Document 1 discloses a structure in which a table RAM for converting a logical address into a sector physical address is provided in a flash memory, and the physical address of a sector that includes a defective memory cell (defective sector) is converted into the physical address of a sector that does not include a defective memory cell (normal sector) to avoid the physical address of the defective sector.

A reconfigurable circuit whose circuit function can be changed by a user with programming after shipment is known as a kind of semiconductor integrated circuit. Examples of the reconfigurable circuit are small-scale logics such as a programmable array logic (PAL) and a generic array logic (GAL) and large-scale logics such as a complex programmable logic device (CPLD) and a field programmable gate array (FPGA). Note that the reconfigurable circuit is referred to as a reconfigurable device or the like in some cases, and is also a programmable circuit.

One reconfigurable circuit can be used for a plurality of purposes by rewriting configuration data stored in a configuration memory or changing configuration data read from the configuration memory. For example, Patent Document 2 discloses an FPGA that is included in a semiconductor chip and tests a CPU, an SRAM, and a DRAM in the semiconductor chip.

REFERENCE

Patent Document 1: Japanese Published Patent Application No. 2000-122935
Patent Document 2: PCT International Publication No. WO 00/62339

SUMMARY OF THE INVENTION

In Patent Document 1, it is necessary to store data for converting the logical address of the normal sector into a physical address in the table RAM. Thus, the table RAM size is huge. It is also necessary to write a program for writing data for converting a logical address into a physical address to the table RAM in the boot sector of the flash memory and to execute the program every startup. Accordingly, the flash memory cannot use the boot sector for the original purpose, so that effectively available memory capacity is decreased. Furthermore, it takes time to start normal operation after startup; thus, the flash memory is not suitable for an application that is frequently powered off to reduce power consumption, such as a mobile device.

In addition, when a specific test circuit is included in a storage device, the test time in product shipment can be shortened. However, since the test circuit is not needed after product shipment, a high-performance test circuit leads to an increase in the manufacturing cost of the storage device.

An object of one embodiment of the present invention is to provide a novel semiconductor device (e.g., a reconfigurable circuit, a storage device, or a redundant circuit), a novel method for driving the semiconductor device, a novel method for testing the semiconductor device, or the like. For example, an object of one embodiment of the present invention is to provide a reconfigurable circuit that can perform configuration easily, a reconfigurable circuit suitable for a redundant circuit of a storage device, a storage device that includes a redundant circuit but has short startup time, a storage device that can replace a defective memory cell with a redundant memory cell and can utilize memory capacity effectively, or a storage device that includes a test circuit but has low manufacturing cost.

Note that the description of a plurality of objects does not disturb the existence of each object. One embodiment of the present invention does not necessarily achieve all the objects. Other objects will be apparent from and can be derived from the description of the specification, the drawings, the claims, and the like, and such objects could be objects of one embodiment of the present invention.

A reconfigurable circuit includes at least one programmable logic element. The programmable logic element includes first to k-th logic circuits (k is an integer of two or more), first to k-th configuration memories, a programmable look-up table, a register, and a multiplexer. The register stores data output from the look-up table. The multiplexer selects and outputs data output from the look-up table or data output from the register. The first to k-th logic circuits each perform an operation of an exclusive-NOR of first to k-th data and first to k-th configuration data output from the first to k-th configuration memories and output an operation result as (k+1)th to 2k-th data. The look-up table performs a logical operation of the (k+1)th to 2k-th data and (2k+1)th data and outputs an operation result as (2k+2)th data.

One embodiment of the present invention is a reconfigurable circuit that includes at least one programmable logic element. The programmable logic element includes first to (k+1)th logic circuits (k is an integer of two or more), first to k-th configuration memories, a programmable look-up table, a register, and a multiplexer. The register stores data output from the look-up table. The multiplexer selects and outputs data output from the look-up table or data output from the register. The first to k-th logic circuits each perform an operation of an exclusive-NOR of first to k-th data and first to k-th configuration data output from the first to k-th configuration memories and output an operation result as (k+1)th to 2k-th data. The (k+1)th logic circuit performs a logical operation of the (k+1)th to 2k-th data and (2k+1)th data and outputs an operation result as (2k+2)th data. The (k+1)th to 2k-th data are input to the look-up table.

A storage device includes a memory portion including a memory cell array including a plurality of memory cells and a redundant circuit. The memory portion includes the memory cell array where the plurality of memory cells are arranged and a peripheral circuit having functions of selecting at least one of the memory cells specified by a logical address, and reading and writing data. The memory cell array includes a first storage area including $2^n$ (n is an integer of one or more) blocks and a second storage area including m (m is an integer, where $1 \leq m < 2^n$) redundant blocks to be substituted for defective blocks where defective memory cells exit in the first storage area. Higher-order m bits function as redundant addresses in the physical addresses of the first and second storage areas, the physical addresses of the $2^n$ blocks each have a structure where a redundant address is added to a higher-order bit of the logical address, and the redundant addresses of the $2^n$ blocks are the same. The redundant addresses of the m redundant blocks are different from each other and different from the redundant address of the first storage area. The redundant circuit includes a memory for storing the logical address of the defective block in the first storage area and generates the redundant address from a logical address stored in the memory and the logical address of the second storage area the access of which is requested. When a redundant address generated in the redundant circuit agrees with any of the redundant addresses of the m redundant blocks, the peripheral circuit has a function of selecting the redundant block.

According to one embodiment of the present invention, it is possible to provide a novel semiconductor device, a novel method for driving the semiconductor device, a novel method for testing the semiconductor device, or the like. For example, according to one embodiment of the present invention, it is possible to provide a reconfigurable circuit that can perform configuration easily, a reconfigurable circuit suitable for a redundant circuit of a storage device, a storage device that includes a redundant circuit but has short startup time, a storage device that can replace a defective memory cell with a redundant memory cell and can utilize memory capacity effectively, or a storage device that includes a test circuit but has low manufacturing cost.

Note that the description of these effects does not disturb the existence of other effects. In one embodiment of the present invention, there is no need to obtain all the effects. In one embodiment of the present invention, other objects, effects, and novel features will be apparent from and can be derived from the description of the specification and the drawings.

BRIEF DESCRIPTION OF THE DRAWINGS

In the accompanying drawings:

FIGS. 10A to 10F illustrate examples of electronic devices and the like.

DETAILED DESCRIPTION OF THE INVENTION

Figure 1:
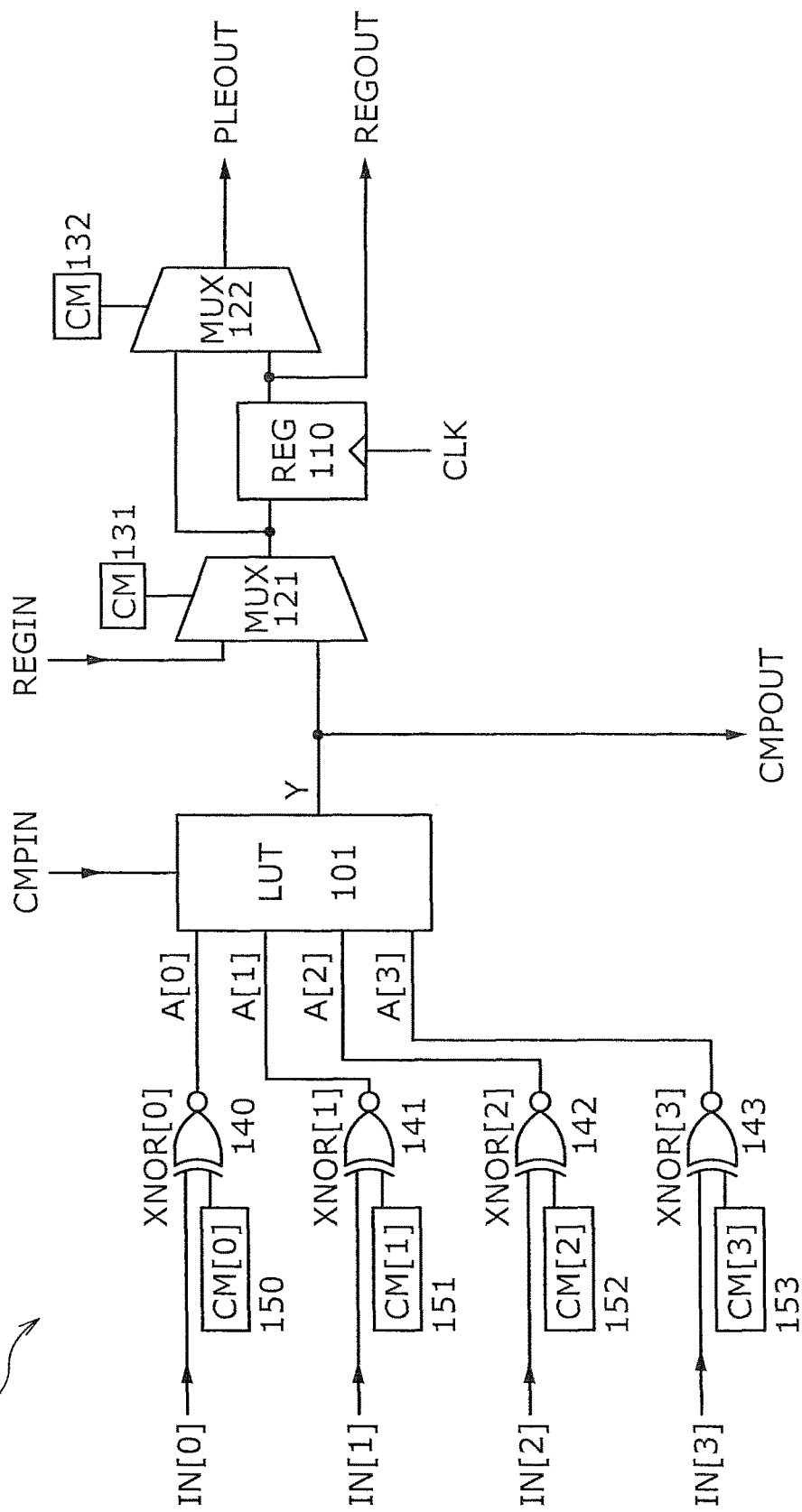
FIG. 1 is a circuit diagram illustrating a structure example of a programmable logic element (PLE)

In this specification, a semiconductor device means a circuit including a semiconductor element (e.g., a transistor or a diode) and a device including the circuit. The semiconductor device also means any device that can function by utilizing semiconductor characteristics. For example, an integrated circuit and a chip including an integrated circuit are all semiconductor devices. Note that a storage device, a display device, a light-emitting device, a lighting device, an electronic device, electrical equipment, a mechanical device, and the like include a semiconductor device according to one embodiment of the present invention in some cases.

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

In the drawings used for the description of embodiments of the present invention, the same portions or portions having similar functions are denoted by the same reference numerals, and description thereof is not repeated.

A plurality of embodiments of the present invention are described below, and any of the embodiments can be combined as appropriate. In addition, in the case where some structure examples are described in one embodiment, any of the structure examples can be combined as appropriate.

(Embodiment 1)

In this embodiment, a reconfigurable circuit is described.

First, structure examples of PLEs are described. The PLE forms a basic logic block (basic logic cell) of a logic portion in a reconfigurable circuit. The PLE itself is also a reconfigurable circuit, which includes at least a look-up table (LUT) for outputting one data value in response to a plurality of input values, a register for storing data, and a configuration memory for storing configuration data.

The reconfigurable circuit includes, for example, a logic array in which a plurality of PLEs are arranged in an array, wirings, and a switch circuit for controlling connection between the wiring and the PLE. A plurality of logic array portions can be provided in the reconfigurable circuit. As described later, in the logic array, registers in adjacent PLEs are cascaded to form a register chain. In the case where carry logic circuits are provided in the PLEs, a carry chain can be formed by cascading the carry logic circuits. Structure examples of PLEs are described below with reference to FIG. 1 and FIG. 2.

<PLE Structure Example 1>

FIG. 1 is a circuit diagram illustrating a structure example of a PLE.

As illustrated in FIG. 1, a PLE 11 includes an LUT 101, a register (REG) 110, a multiplexer (MUX) 121, an MUX 122, a configuration memory (CM) 131, a CM 132, logic circuits 140 to 143, and CMs 150 to 153.

The PLE 11 is a logic circuit that has four inputs (IN[0] to IN[3]) and two outputs (PLEOUT and REGOUT). The number of inputs and the number of outputs are not limited thereto. The number of inputs may be any number as long as it is two or more, and the number of outputs may be any number as long as it is one or more.

The LUT 101 outputs data Y in response to input data (A[0] to A[3]) and data CMPIN. The arithmetic function of the LUT 101 is set by configuration data stored in an internal CM. In other words, the LUT 101 is a programmable logic circuit, and the function of the LUT 101 as a logic circuit can be changed by rewriting configuration data stored in the CM or by changing configuration data read from the CM.

The data Y is output from the PLE 11 as data CMPOUT. CMPOUT is input to the LUT 101 of the PLE 11 in the next stage as CMPIN. CMPIN is data that corresponds to data CMPOUT(Y) output from the LUT 101 of the PLE 11 in the previous stage. Note that the data CMPIN input to the LUT 101 is not limited to the data CMPOUT output from the PLE 11 in the previous stage, and may be changed depending on the circuit structure of the PLE 11. For example, data input from the outside or the data PLEOUT output from another PLE 11 can be used.

Note that as described above, the data CMPOUT is abbreviated to CMPOUT in some cases. The same applies to another data, signals, circuits, elements, wirings, and the like.

The MUXs 121 and 122 output one of two input data in accordance with configuration data stored in the CMs 131 and 132. Outputs of the MUX 121 and the REG 110 are input to the MUX 122, and the MUX 122 outputs one of the outputs as the data PLEOUT output from the PLE 11. In other words, the MUX 122 has a function of outputting PLEOUT in synchronization with or asynchronous to a clock signal CLK.

The data REGOUT output from the REG 110 can be used as data REGIN input to the MUX 121 of the PLE 11 in the next stage. With such connection, a register chain (shift register) in which the plurality of REGs 110 are cascaded is formed. The MUX 121 and the REG 110 forms a register chain logic circuit. The MUX 121 has a function of switching the data REGOUT output from the PLE 11 into the data Y output from the LUT 101 or the data REGIN input to the register chain.

The input data (IN[0] to IN[3]) of the PLE 11 are input to the logic circuits 140 to 143, respectively. The logic circuits 140 to 143 perform logical operations of configuration data output from the CMs 150 to 153 and IN[0] to IN[3], and output data A[0] to A[3].

The logic circuit 140 has a function of outputting a logical value that is the same as the logical value of IN[0] or a logical value obtained by inversion of the logical value. Here, the logic circuit 140 is formed using an exclusive-NOR circuit (XNOR) having two inputs. One of the inputs of the logic circuit 140 (XNOR) is IN[0], and the other of the inputs of the logic circuit 140 is an output of the CM 150. The output of the CM 150 is used as configuration data stored in the CM 150. The logical value of the output of the logic circuit 140 is determined by configuration data stored in the CM 150.

The logic circuits 141 to 143 are similar to the logic circuit 140. In the following description, in some cases, the logic circuits 140 to 143 are referred to as XNOR[0] to XNOR[3] and the CMs 150 to 153 are referred to as CM[0] to CM[3].

XNOR[0] to XNOR[3] output "1" when the logical values of all the inputs are the same and output "0" when the logical values of all the inputs are different. Thus, A[0] to A[3] have the same logical values as IN[0] to IN[3] when configuration data stored in CM[0] to CM[3] is "1," and A[0] to A[3] have logical values obtained by inversion of the logical values of IN[0] to IN[3] when configuration data stored in CM[0] to CM[3] is "0."

Since the PLE 11 can internally produce data obtained by inversion of the logical values of the input data IN[0] to IN[3] in this manner, it is not necessary to generate a signal obtained by inversion of the output of the PLE 11. For example, in the case where "1" is stored in CM[0] to CM[3] in one of two PLEs 11, "0" is stored in CM[0] to CM[3] in the other of the two PLEs 11, and the same data are input to the PLEs 11 as IN[0] to IN[3], one of the PLEs 11 can perform a logical operation of IN[0] to IN[3] and the other of the PLEs 11 can perform a logical operation of signals obtained by inversion of the inputs IN[0] to IN[3]. Accordingly, the PLE 11 can simplify configuration of the reconfigurable circuit.

As a specific circuit structure example of the PLE 11, the LUT 101 serves as an AND circuit that performs an operation of AND of the input data A[0] to A[3] and CMPIN. Thus, the PLE 11 can determine whether IN[0] to IN[3] agree with configuration data stored in CM[0] to CM[3].

When the logical values of IN[0] to IN[3] agree with configuration data in CM[0] to CM[3], A[0] to A[3] are "1." In addition, when CMPIN is "1," the data Y (CMPOUT) output from the LUT 101 is "1." On the other hand, when any of the logical values of IN[0] to IN[3] does not agree with any of configuration data in CM[0] to CM[3], any of A[0] to A[3] is "0." Thus, CMPOUT is "0" regardless of the logical value of CMPIN. In other words, the logical value of CMPOUT indicates whether all the logical values of IN[0] to IN[3] agree with configuration data in CM[0] to CM[3]. Accordingly, the PLE 11 can operate as a 4-bit coincidence circuit related to 4-bit input data (IN[0] to IN[3]).

As described above, in the case of a reconfigurable circuit including the plurality of PLEs 11, by cascading the LUTs 101 in the plurality of adjacent PLEs 11, the reconfigurable circuit can function as a coincidence circuit of input data with a larger bit number.

<PLE Structure Example 2>

Figure 2:
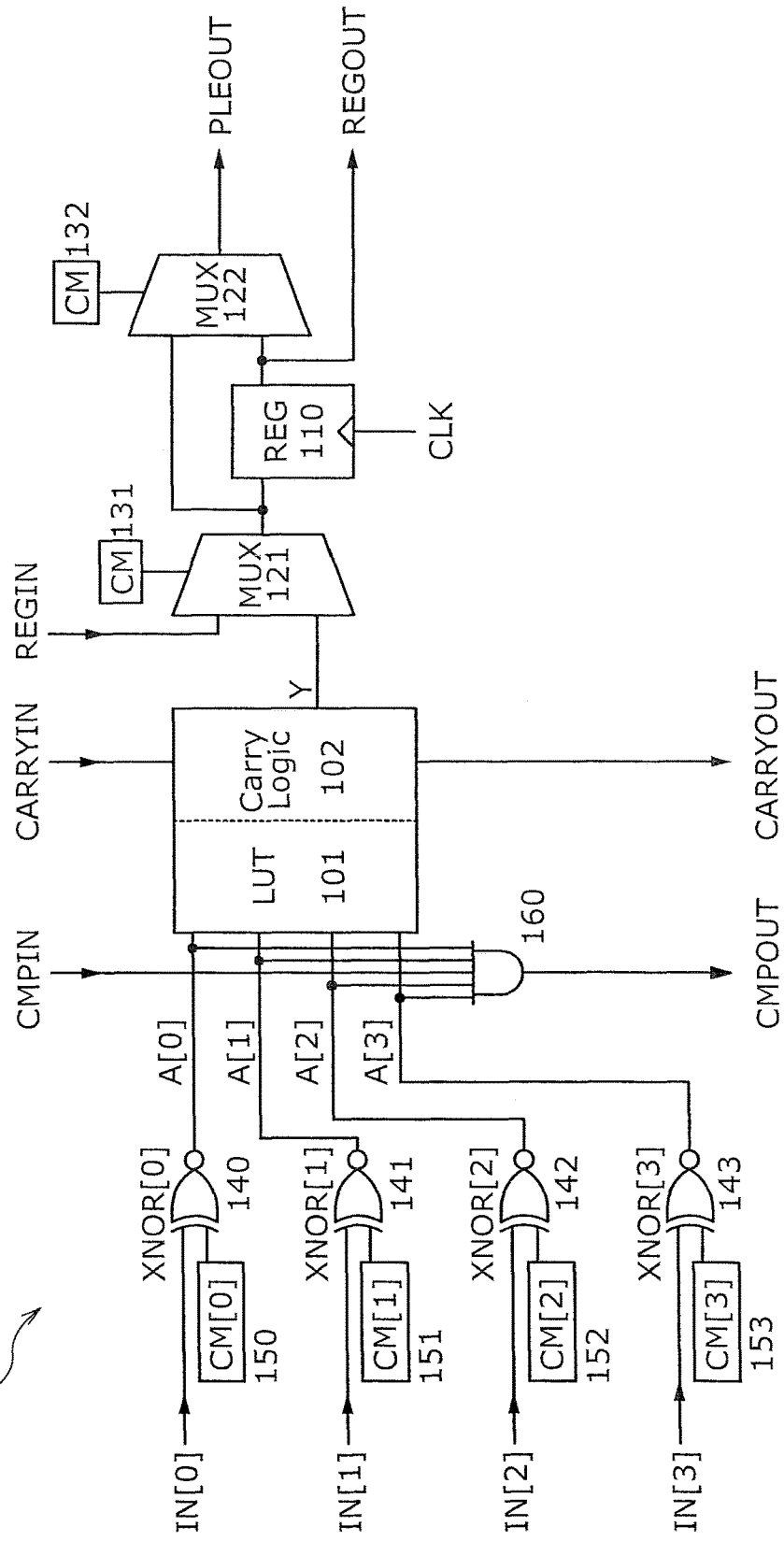
FIG. 2 is a circuit diagram illustrating a structure example of a PLE.

FIG. 2 is a circuit diagram illustrating a structure example of a PLE.

As illustrated in FIG. 2, a PLE 12 corresponds to a circuit in which a carry logic circuit 102 and a logic circuit 160 are added to the PLE 11. When the logic circuits 140 to 143 are exclusive-NOR circuits also in the PLE 12, configuration of the PLE 12 can be simplified as in the PLE 11.

The carry logic circuit 102 has a function of generating a carry signal. The carry logic circuit 102 performs a logical operation of the data Y input from the LUT 101 and data CARRYIN input from the carry logic circuit 102 in the previous stage, and generates and outputs a carry signal CARRYOUT. CARRYOUT is input to the carry logic circuit 102 of the PLE 12 in the next stage as CARRYIN. In other words, in a logic array constituted of the plurality of PLEs 12, the carry logic circuits 102 are cascaded to form a carry chain. The carry chain facilitates formation of an arithmetic operation circuit such as an adder circuit using the plurality of PLEs 12. Note that as in the PLE 12, the carry logic circuit 102 may be formed in the PLE 11 (FIG. 1).

The logic circuit 160 performs a logical operation of A[0] to A[3] and CMPIN and outputs the operation result as the data CMPOUT. CMPOUT is input to the PLE 12 in the next stage as the data CMPIN. In other words, in the logic array constituted of the plurality of PLEs 12, the plurality of logic circuits 160 are cascaded.

Note that although the logic circuit 160 is an AND circuit here, the logic circuit 160 is not limited thereto. In FIG. 2, CMPOUT is "1" in the case where all the logical values of the data A[0] to A[3] and CMPIN input to the logic circuit 160 are "1," and CMPOUT is "0" in the case where not all the logical values of the data A[0] to A[3] and CMPIN input to the logic circuit 160 are "1."

As illustrated in FIG. 2, when the logic circuit 160 is an AND circuit, a logic circuit (constituted of the logic circuits 140 to 143 and 160) can function as a coincidence circuit that determines whether all the logical values of IN[0] to IN[3] agree with configuration data in CM[0] to CM[3].

The operation of this coincidence circuit is described by giving an example in which configuration data stored in CM[0] to CM[3] are all "0" in one PLE 12. In such a case, "1" is input to the logic circuit 160 as CMPIN. When IN[0] to IN[3] are all "0," the data A[0] to A[3] output from XNOR[0] to XNOR[3] are all "1." Thus, the data CMPIN and A[0] to A[3] input to the logic circuit 160 are "1," so that the data CMPOUT output from the logic circuit 160 is "1." When any of IN[0] to IN[3] is "1," the data CMPOUT output from the logic circuit 160 is "0." In other words, the logical value of CMPOUT indicates whether all the logical values of IN[0] to IN[3] agree with configuration data. In this manner, as in the PLE 11, the PLE 12 can operate as a 4-bit coincidence circuit related to 4-bit data (IN[0] to IN[3]).

When the plurality of logic circuits 160 are cascaded in the logic array constituted of the PLEs 12, whether input data with a larger bit number agrees with data stored in a corresponding configuration memory can be determined.

<Structure Example of Reconfigurable Circuit>

Figure 3:
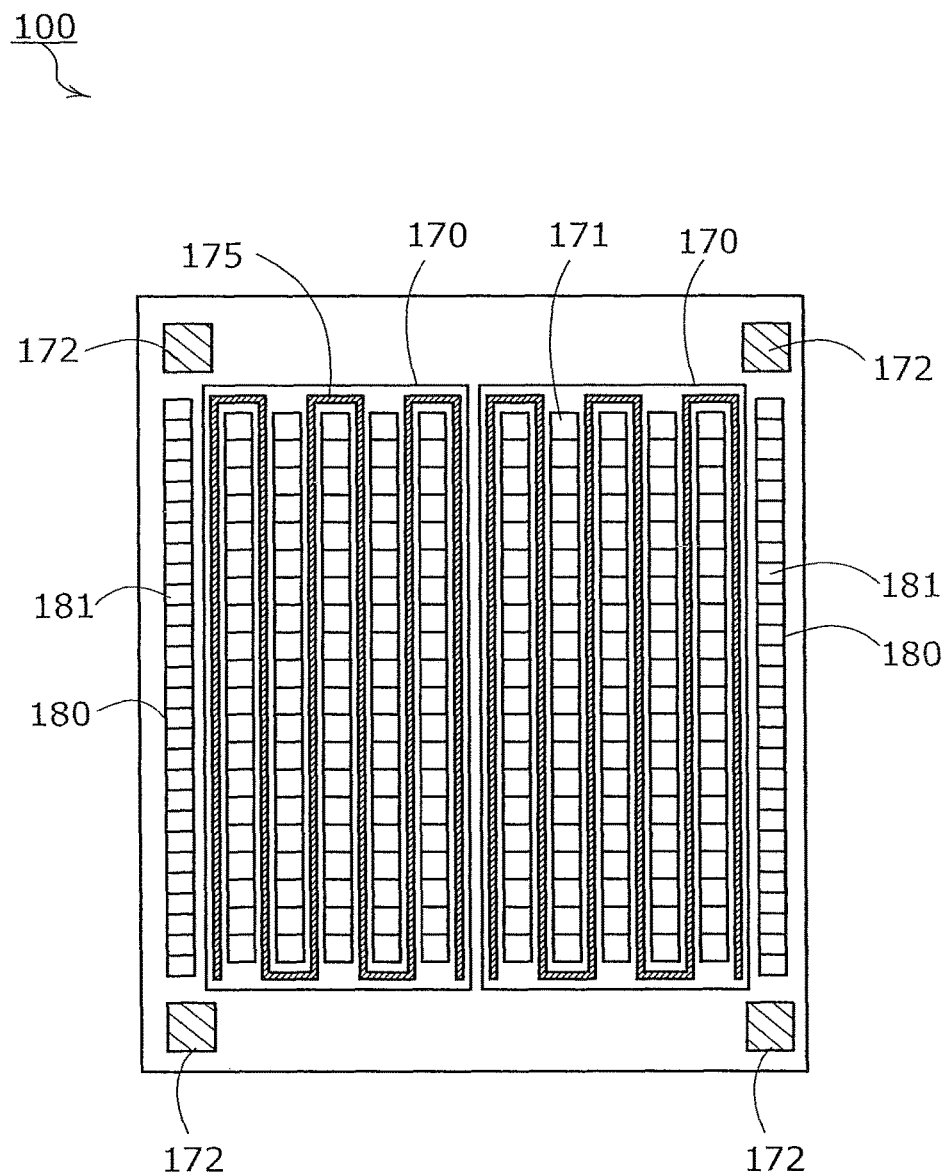
FIG. 3 is a plan view illustrating a structure example of a reconfigurable circuit.

FIG. 3 is a plan view illustrating a structure example of a reconfigurable circuit. A reconfigurable circuit 100 includes logic arrays 170, phase lock loops (PLL) 172, and input/output portions (IO) 180.

The logic array 170 includes a plurality of PLEs 171 and routing resources 175. Another PLE in this embodiment can be used as the PLE 171. The routing resource 175 includes wirings and a programmable switch that connects the wiring and the PLE 171. The PLL 172 has a function of generating a clock signal. A plurality of input/output circuits 181 are arranged in an array in the IO 180, as illustrated in FIG. 3. The PLE 171 can be connected to any of the input/output circuits 181 in the IO 180 by the switch circuit of the routing resource 175.

Needless to say, the structure of the reconfigurable circuit 100 is not limited to the structure in FIG. 3. For example, a peripheral circuit (e.g., a driver circuit or a control circuit) for driving a configuration memory of the PLE 171 may be provided. Alternatively, it may be possible not to provide the PLL 172 and to input a clock signal from the outside.

(Embodiment 2)

In this embodiment, a storage device, especially, a storage device including a redundant circuit is described.

Figure 4:
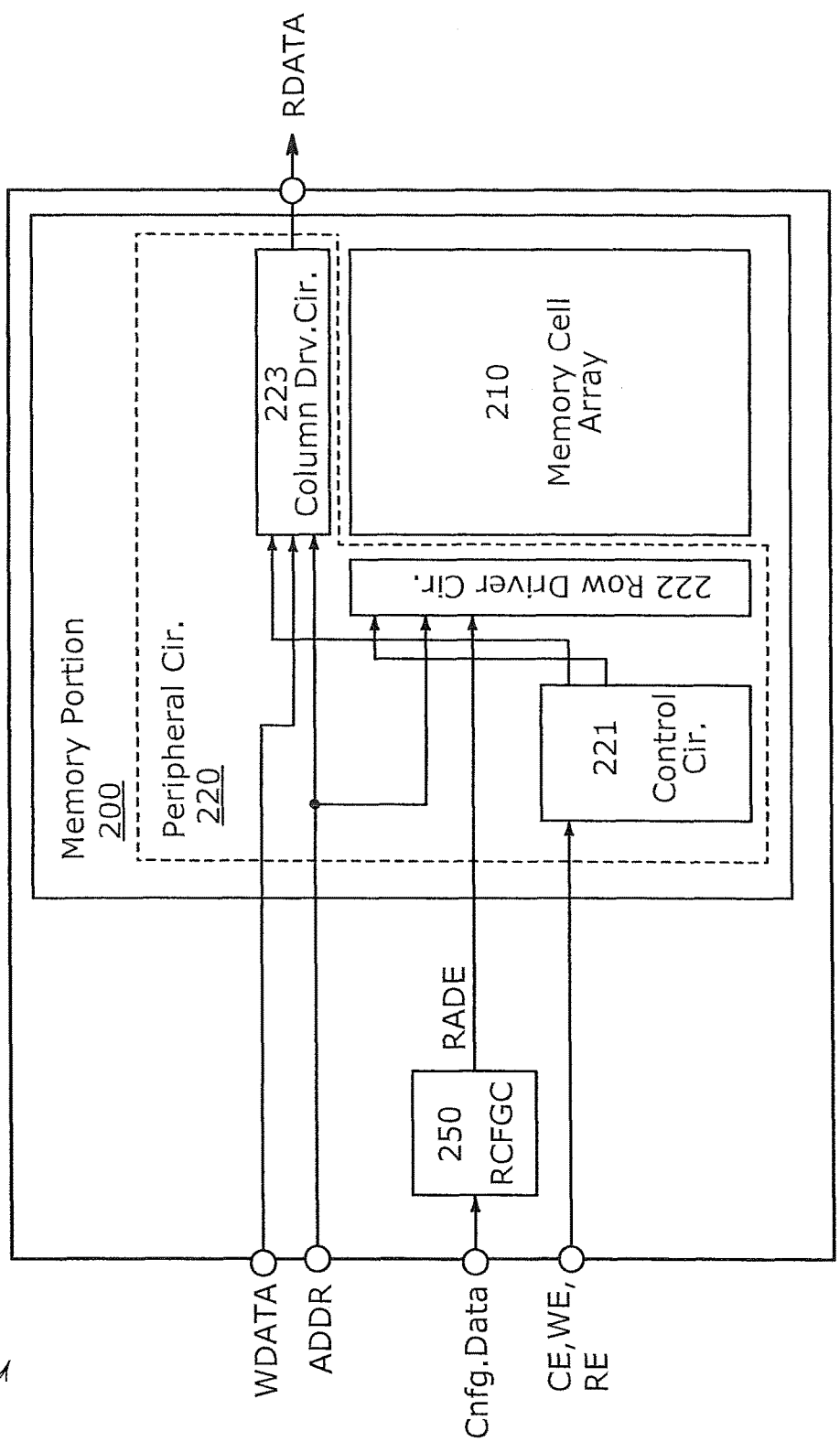
FIG. 4 is a block diagram illustrating a structure example of a storage device.

FIG. 4 is a block diagram illustrating a structure example of a storage device. A storage device 20 includes a memory portion 200 and a reconfigurable circuit (RCFGC) 250. The RCFGC 250 functions as a redundant circuit.

<Memory Portion>

The memory portion 200 includes a memory cell array 210 and a peripheral circuit 220. The memory cell array 210 is a circuit in which a plurality of memory cells are arranged in an array. The position of each memory cell can be specified by its address. The memory cell array 210 has a function of controlling writing and reading data to and from the memory cell array 210 in response to control signals CE, WE, and RE, address data ADDR, and the like from the outside and a function of controlling data transmission and reception to and from the outside.

There is no particular limitation on the structure of the memory portion 200. For example, the memory portion 200 can be an SRAM, a DRAM, a flash memory (NOR or NAND flash memory), a phase change RAM (PRAM), a magnetoresistive RAM (MRAM), a resistive RAM (Re-RAM), or the like.

The circuit structure and signal path of the peripheral circuit 220 differ depending on the circuit structure of the memory cell array 210. In FIG. 4, the memory cell array 210 includes a control circuit 221, a row driver circuit 222, and a column driver circuit 223. In addition, the address data ADDR, write data WDATA, and the control signals CE, WE, and RE are input to the peripheral circuit 220 from the outside. A chip enable signal, a write enable signal, and a read enable signal are referred to as CE, WE, and RE, respectively. Not all the signals are needed, and another signal may be input.

The control circuit 221 has a function of controlling the memory portion 200. The control circuit 221 generates and outputs control signals of other circuits 222 and 223 provided in the peripheral circuit 220 in response to control signals and the like supplied from the outside. In FIG. 4, CE, WE, and RE are input to the control circuit 221.

The row driver circuit 222 controls the potential of a row line (specifically, a word line). Specifically, the row driver circuit 222 has a function of generating a signal for selecting the row of the memory cell array 210 that is specified by ADDR. The row driver circuit 222 can include, for example, a row decoder for decoding ADDR and an address buffer for retaining ADDR.

The data WDATA to be written to the memory cell array 210 is input to the column driver circuit 223, and the column driver circuit 223 outputs read data RDATA. The column driver circuit 223 controls the potential of a column line (specifically, a bit line) and has a function of controlling the potential of a bit line in a column of the memory cell array 210 that is specified by ADDR or the like in response to a write or read request. For example, the column driver circuit 223 can include an address decoder for decoding ADDR, a write circuit for supplying a potential based on WDATA to a bit line, a sense amplifier, a read circuit for outputting a signal read from the memory cell array 210 through the sense amplifier as RDATA, and the like.

The memory cell array 210 includes a normal area constituted of a plurality of blocks to be accessed normally and a redundant area. The redundant area includes one or more blocks that are replaced with a defective block in the normal area. Each block in the normal area and the redundant area includes a plurality of memory cells.

The RCFGC 250 includes the PLE described in Embodiment 1, and the circuit structure of the RCFGC 250 can be changed depending on the usage. For example, the RCFGC 250 can function as a test circuit of the memory portion 200 in a test step, and can function as a redundant circuit for compensating for a defective memory cell after shipment. A structure example and an operation example of the RCFGC 250 are described below with reference to FIG. 5 and FIG. 6.

<Address Space>

Figure 5:
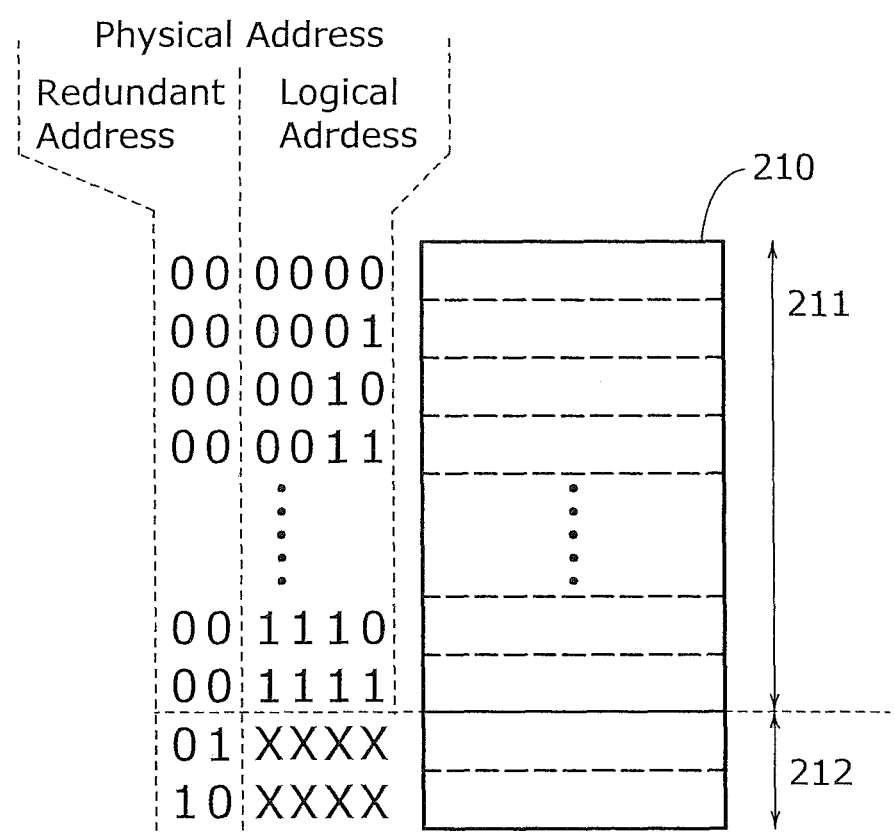
FIG. 5 illustrates a structure example of a storage device address space.

First, the address space of the memory portion 200 is described with reference to FIG. 5. FIG. 5 illustrates structure examples of the RCFGC 250 and the address space of the memory cell array 210.

Note that here, the block unit of each of a normal area 211 and a redundant area 212 in the memory cell array 210 is one row of the memory cell array 210. In addition, the block unit of the address space is one row, the number of rows in the memory cell array 210 is 18, the number of rows in the normal area 211 is 16, and the number of rows in the redundant area 212 is 2. As illustrated in FIG. 5, the memory cell array 210 includes 18 blocks. Specifically, the normal area 211 includes 16 blocks and the redundant area 212 includes 2 redundant blocks.

Here, the address length of the physical address of the memory cell array 210 is six bits. Lower one to four bits of the physical address of the normal area 211 correspond to the logical address of the storage device 20 (the memory cell array 210). The physical addresses of the normal area 211 are "000000," "000001," "000010," . . . "001110," and "001111." The physical addresses of the redundant area 212 are "01XXXX" and "10XXXX." A given address is represented by "XXXX." The lower four bits of the physical address of the redundant block do not need to be any particular address in this manner because the peripheral circuit 220 can select a redundant block that should be accessed without decoding of address data. This is described later. Consequently, the addresses "XXXX" of the lower four bits of the two redundant blocks in the redundant area 212 may be the same or different.

Higher-order two bits of the physical address of the memory cell array 210 are data for determining whether each block is in the normal area 211 or in the redundant area 212. Here, the higher-order two bits are referred to as a redundant address. The redundant address of the normal area 211 in all the blocks is "00." On the other hand, in the redundant area 212, the redundant addresses of the redundant blocks are different from each other and different from the redundant address of the normal area 211. Here, the redundant addresses of the redundant area 212 are "01" and "10."

Note that in FIG. 5, the number of blocks in the normal area 211 is $16=2^4$ and the number of blocks in the redundant area 212 is 2; however, the number of blocks in each area is not limited thereto. Generally, the number of blocks in the normal area 211 can be $2^n$ (n is an integer of one or more) and the number of blocks in the redundant area 212 can be m (m is an integer, where $1 \leq m \leq 2^n$). In that case, the bit length of the logical address is n and the bit length of the redundant address is in. The redundant address of the normal area 211 is in "0," and the physical address of the normal area 211 is obtained by addition of m "0" to higher-order bits of an n-bit logical address. The redundant addresses of m redundant blocks are different from each other, any one of the bits is "1," and the other bits are "0." For example, in the case of three redundant blocks, the redundant addresses of the redundant blocks are "001," "010," and "100."

Figure 6:
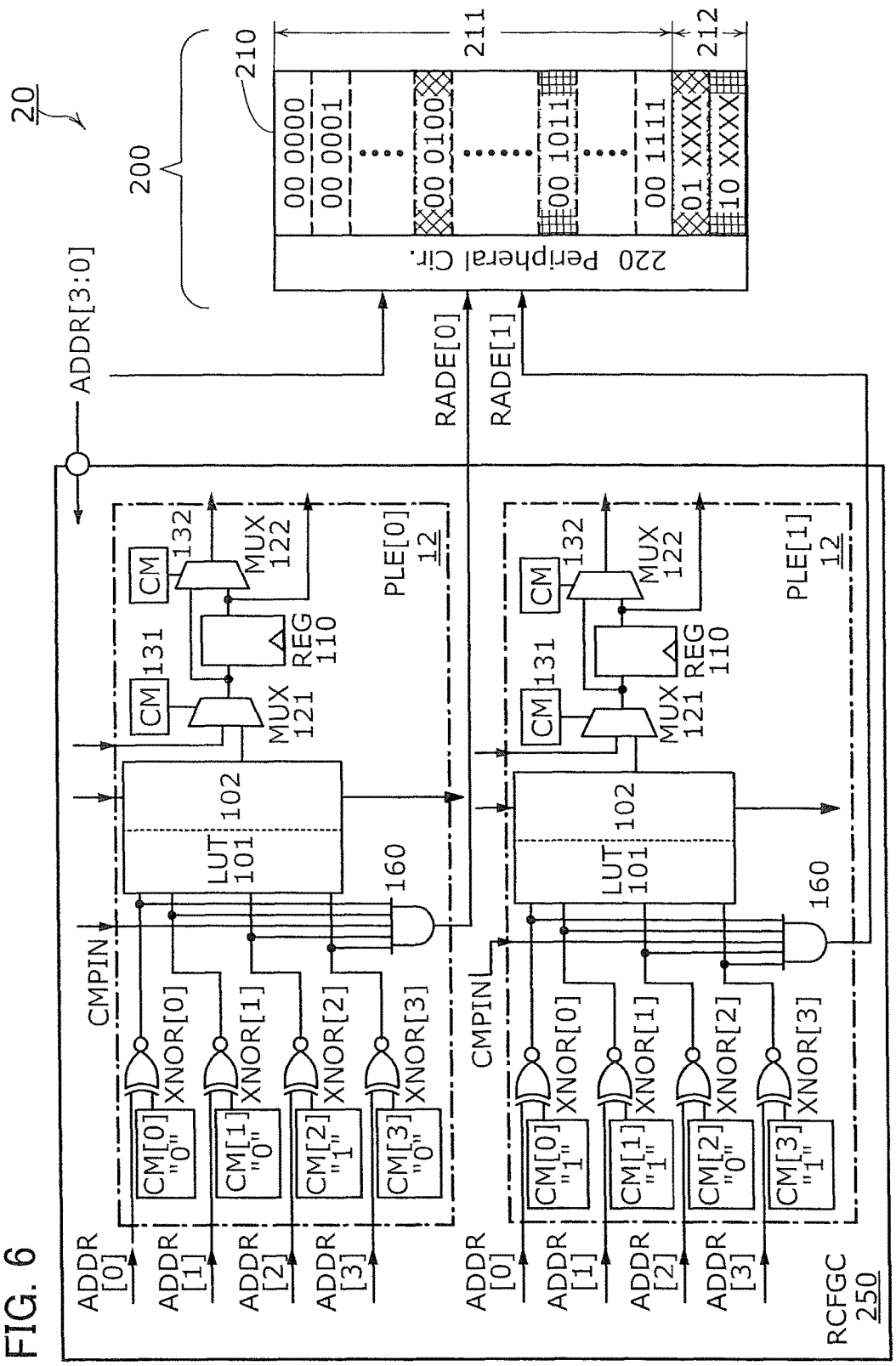
FIG. 6 illustrates a structure example of a reconfigurable circuit (RCFGC) included in a storage device.

By employing the address space of the memory portion 200 as illustrated in FIG. 5, it is not necessary to provide a memory portion that stores an address conversion table for replacing a defective block in the normal area 211 with a redundant block. In FIG. 6, when there is a request to access the defective block, the redundant block is made to be accessed by generating an enable signal RADE in the RCFGC 250. A structure example of the RCFGC 250 and an operation example of the storage device 20 are described with reference to FIG. 6.

<Structure Example of Reconfigurable Circuit (RCFGC)>

In FIG. 6, two redundant blocks are provided in the memory cell array 210; thus, the memory cell array 210 can include two defective blocks. The RCFGC 250 includes at least two PLEs 12 in accordance with the number of redundant blocks. While the storage device 20 performs normal operation, the RCFGC 250 functions as a redundant circuit. Here, the RCFGC 250 determines whether a logical address the access of which is requested is the address of the defective block and outputs the determination result to the peripheral circuit 220 in the memory portion 200 as a redundant address enable signal RADE[1:0].

Here, in some cases, one of the two PLEs 12 is referred to as PLE[0] and the other of the two PLEs 12 is referred to as PLE[1]. CM[0] to CM[3] of PLE[0] and PLE[1] store the logical addresses of different defective blocks. Here, configuration data stored in CM[0] to CM[3] are data on the most significant bit (fourth bit) to the least significant bit (first bit) of a logical address (ADDR[3:0]). Logical addresses the access of which is requested are input to PLE[0] and PLE[1] as ADDR[3] to ADDR[0]. ADDR[3] to ADDR[0] are data on the most significant bit (fourth bit) to the least significant bit (first bit) of the logical address. PLE[0] outputs "1" as RADE[0] in the case where ADDR[3] to ADDR[0] all agree with address data stored in CM[3] to CM[0], and outputs "0" in the case where not all ADDR[3] to ADDR[0] agree with address data stored in CM[3] to CM[0]. The same applies to PLE[1]. In this example, RADE[1:0] is "10" or "01" in the case where access to a defective block is detected in the RCFGC 250, and RADE [1:0] is "00" in the case where access to a defective block is not detected in the RCFGC 250. In the peripheral circuit 220, whether the normal area 211 is accessed or the redundant area 212 is accessed is determined by RADE[1:0]. An operation example of the RCFGC 250 when the storage device 20 performs normal operation is described below with reference to a specific example.

<Normal Operation of Storage Device>

Here, blocks with logical addresses "0100" and "1011" are defective blocks, and physical addresses of redundant blocks for these blocks are "01XXXX" and "10XXXX." CM[0] to CM[3] of PLE[0] store the logical address "0100" of the defective block, and CM[0] to CM[3] of PLE[1] store the logical address "1011" of the defective block (see FIG. 6). Since the logical address is 4-bit data, one PLE 12 is used to produce data of each bit of RADE[1:0]; thus, data "1" is input to PLE[0] and PLE[1] as CMPIN. Note that in the case where the number of defective blocks is 1 or 0, "0" is input to the PLE 12 that does not store the logical address of the defective block as CMPIN.

In the case where a normal block is accessed, for example, in the case where the access of the block of a logical address "0001" is requested, "0001" is input to PLE[0] and PLE[1] as ADDR[3:0]; thus, RADE[1:0] output from the RCFGC 250 is "00." In the case where RADE[1:0] is "00," the peripheral circuit 220 decodes ADDR[3:0] and selects a block of the logical address "0001" in the normal area 211.

In the case where the defective block is accessed, specifically, in the case where ADDR[3:0] is "0100" or "1011," RADE[1:0] is "01" or "10." In the case where RADE[1:0] is not "00," the peripheral circuit 220 selects a defective block that has the same redundant address as RADE[1:0]. An unnecessary block "01XXXX" is selected in the case where RADE[1:0] is "01," and a defective block "10XXXX" is selected in the case where RADE[1:0] is "10."

When the address space of the memory cell array 210 has the structure illustrated in FIG. 5 in this manner, the RCFGC 250 (redundant circuit) determines whether an address the access of which is requested agrees with the logical address of a defective block and uses data (RADE) showing the determination result, so that a redundant block can be accessed without the use of an address conversion table. Accordingly, the RCFGC 250 can convert an address at high speed.

Here, although the bit length of the logical address is four, the bit length is not limited thereto. When the bit length is more than four, the plurality of PLEs 12 in which the logic circuits 160 are cascaded are used to generate RADE[0] and RADE[1]. In addition, the number of redundant blocks is not limited to two. The bit length of the redundant address enable signal RADE depends on the number of redundant blocks; thus, connection of the plurality of PLEs 12 is determined so that data on each bit of RADE can be produced.

Furthermore, memory capacity can be increased when the memory cell array 210 is set as a subarray and a plurality of subarrays are provided in the memory portion 200. In that case, the circuit structure of the RCFGC 250 is set so that RADE can be output to each subarray.

<Storage Device Test>

The RCFGC 250 can operate as a test circuit of the storage device 20 (the memory cell array 210). In the test of the memory cell array 210, data is written and read to and from a memory cell of a specified address, and a logical operation of read data and an expectation value is performed. If the expected logical value is obtained, the memory cell is determined to be normal. If the expected logical value is not obtained, the memory cell is determined to be defective. Here, the RCFGC 250 operates as a circuit for producing address data (logical address or redundant address) of a block to be tested, and an external computer system (e.g., a tester) of the storage device 20 produces data to be written to the memory cell array 210 and performs a logical operation of read data and an expectation value. Note that depending on the circuit size of the RCFGC 250, the RCFGC 250 may produce data and/or perform a logical operation of read data and an expectation value.

When the normal area 211 is tested, "00" is output from the RCFGC 250 to the peripheral circuit 220 as RADE[1:0]. In addition, the RCFGC 250 sequentially generates 16 logical addresses and outputs the logical addresses to the peripheral circuit 220. The peripheral circuit 220 accesses each block in the normal area 211 in accordance with a logical address generated in the RCFGC 250, and writes and reads data. When the redundant area 212 is tested, the RCFGC 250 sequentially generates the redundant addresses of the redundant area 212 as RADE[1:0]. The peripheral circuit 220 accesses the redundant block in the redundant area 212 in accordance with RADE[1:0], and writes and reads data.

When the external computer system detects a defective block in the memory cell array 210, the external computer system stores the logical address of the defective block. In the case where the number of defective blocks in the normal area 211 is more than two, the storage device 20 is defective. Also in the case where the redundant block in the redundant area 212 is defective, the storage device 20 is defective. Note that in that case, when the number of defective blocks in the normal area 211 is smaller than or equal to the number of normal redundant blocks in the redundant area 212, the storage device 20 may be a normal product that can be shipped.

After the test, in the storage device 20 that is a normal product but has a defective block, logical address data of the defective block that is stored in the external computer system is written to the configuration memories (CM[0] to CM[3]) of PLE[0] and/or PLE[1] in the RCFGC 250.

Note that in normal operation of the storage device 20, in PLE[0] and PLE[1], circuits other than CM[0] to CM[3], XNOR[0] to XNOR[3], and the logic circuit 160 do not contribute to actual operation as a redundant circuit; thus, it may be possible to stop supply of power supply voltage to such circuits. In addition, in the RCFGC 250, it may be possible to stop supply of power supply voltage in each of the PLEs 12 and to stop supply of power supply voltage to the PLE 12 that does not operate as a redundant circuit or a test circuit. Accordingly, the power consumption of the storage device 20 can be reduced.

Note that the RCFGC 250 can operate only as a redundant circuit. In that case, it is only necessary to provide a circuit for generating RADE in the RCFGC 250; thus, the circuit size can be further reduced. PLE[0] and PLE[1] can include only CM[0] to CM[3], XNOR[0] to XNOR[3], and the logic circuit 160.

FIG. 6 is a structure example of a redundant circuit provided in the storage device 20. The redundant circuit has a function of generating a redundant address enable signal when a logical address the access of which is requested agrees with the logical address of a defective block. Furthermore, a memory for storing the logical address of the defective block may be included in the redundant circuit or may be provided as another circuit.

In FIG. 6, the PLE 12 is used as a programmable logic element of the RCFGC 250; however, the programmable logic element of the RCFGC 250 is not limited thereto. For example, the programmable logic element described in Embodiment 1 such as the PLE 11 can be used. In the case where the PLE 11 is used, in normal operation of the storage device 20, it may be possible to stop supply of power supply voltage to circuits other than CM[0] to CM[3], XNOR[0] to XNOR[3], and the LUT 101.

As described above, when a reconfigurable circuit is included in a storage circuit, the reconfigurable circuit can operate as a test circuit in a manufacturing process and can operate as a redundant circuit for replacing a defective block with a redundant block after shipment. Thus, the increase in the manufacturing cost of the storage device can be reduced.

The redundant circuit in this embodiment can operate by storing only the address of a defective block; thus, it is not necessary to provide an address conversion memory portion for storing all the logical addresses. Thus, the circuit size of the redundant circuit is reduced, so that the manufacturing yield of the storage device can be improved. In addition, it is not necessary to store a program that controls the address conversion memory portion in a storage area; thus, it is not necessary to execute the program. Accordingly, there is no waste of the storage area, a first storage area can be utilized effectively, and startup time can be shortened.

(Embodiment 3)

The reconfigurable circuit in Embodiment 1 can be used as processors (e.g., CPUs, microcontrollers, and wireless chips) in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Figure 7:
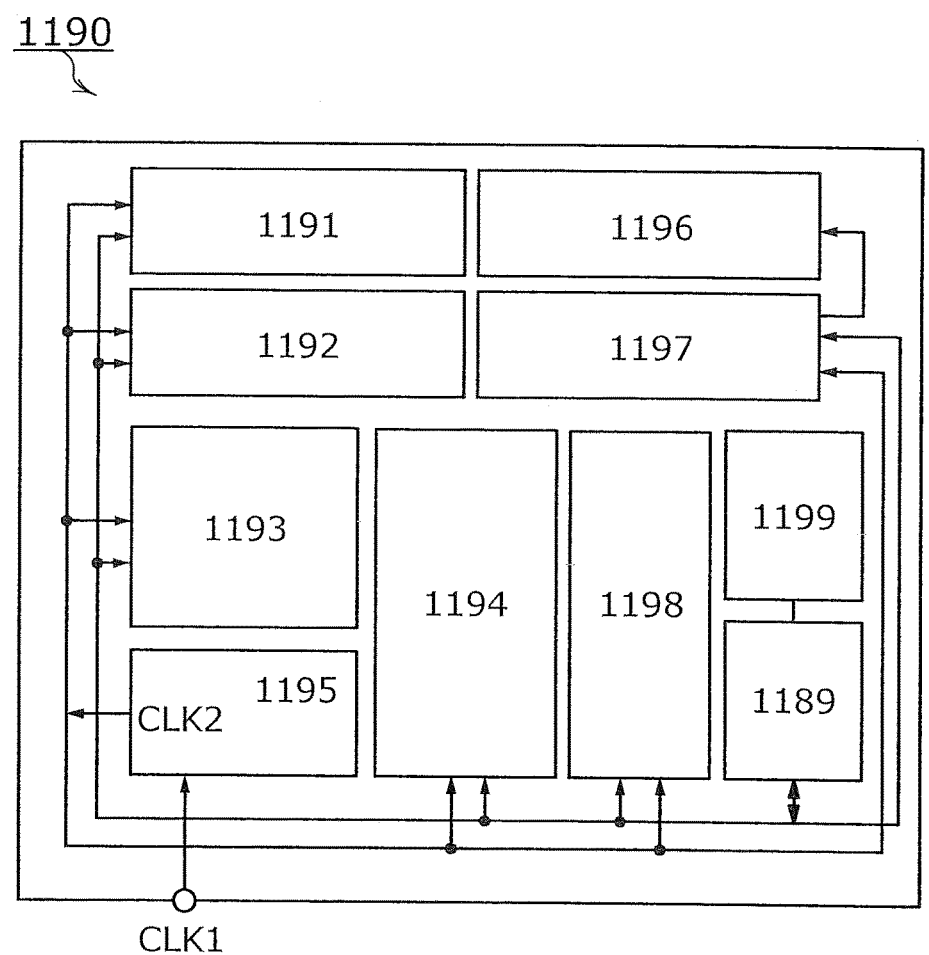
FIG. 7 is a block diagram illustrating a structure example of a CPU.
Figure 8:
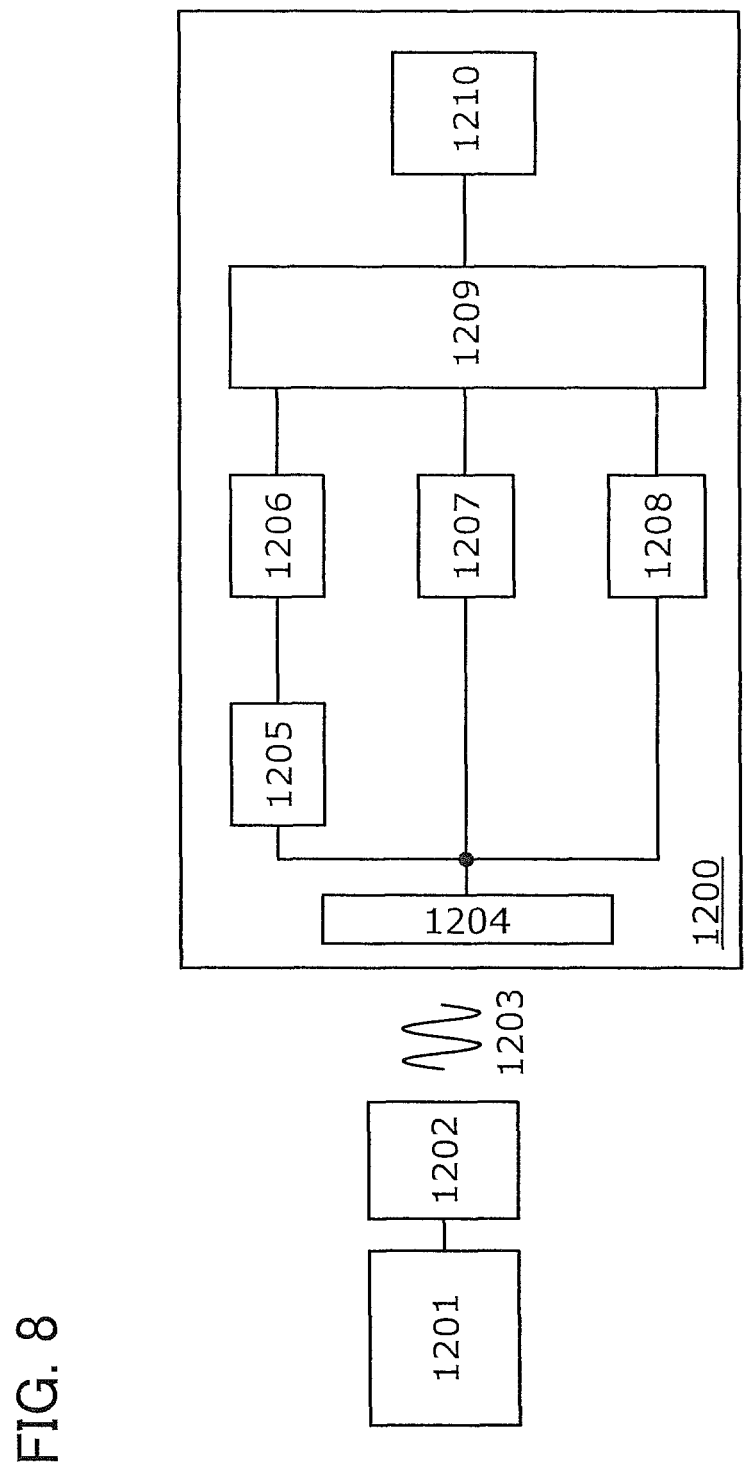
FIG. 8 is a block diagram illustrating a structure example of a wireless chip.
Figure 9A:
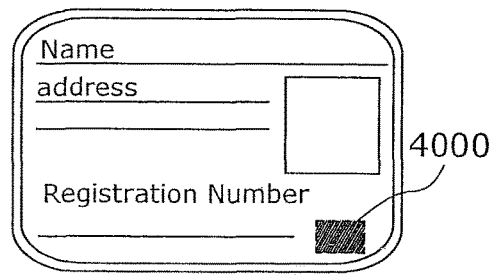
FIGS. 9A to 9F illustrate usage examples of an RFID tag.
Figure 9B:
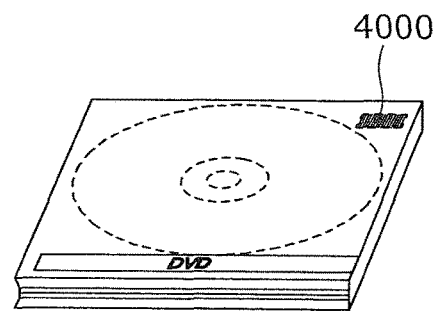
Figure 9C:
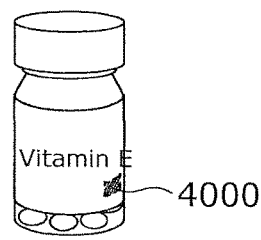
Figure 9D:
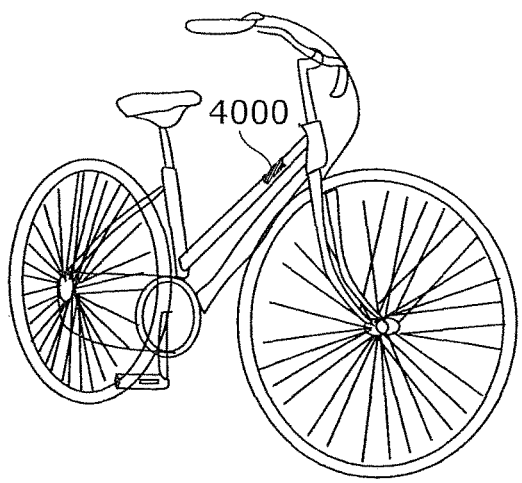
Figure 9E:
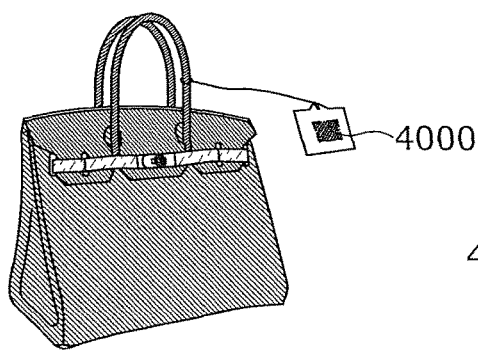
Figure 9F:
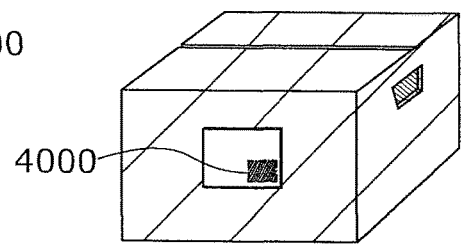

The storage device in Embodiment 2 can be used as a storage device such as a USB memory, an SD memory card, or a solid state drive (SSD). Alternatively, the storage device in Embodiment 2 can be used as a storage of a main memory in a processor such as a CPU, a microcontroller, or a wireless chip (e.g., an RFID tag). When an arithmetic processing portion such as a CPU core, a storage device, an input/output circuit, and the like are included in one IC chip, a CPU chip (CPU chip set), a microcontroller, a wireless chip, or the like can be formed. FIG. 7 illustrates a structure example of a CPU, and FIG. 8 illustrates a structure example of a wireless chip.

<CPU>

As illustrated in FIG. 7, a CPU 1190 includes an arithmetic logic unit (ALU) 1191, an ALU controller 1192, an instruction decoder 1193, an interrupt controller 1194, a timing controller 1195, a register 1196, a register controller 1197, a bus interface 1198, a memory portion 1199, and a memory interface 1189. The memory portion 1199 functions as a main memory of the CPU 1190 and stores an instruction and data. The data bit length of the CPU 1190 can be, for example, 8 bits, 16 bits, 32 bits, or 64 bits.

The circuits of the CPU 1190 are included in one IC chip. The storage device in Embodiment 2 can be used as the memory portion 1199. Thus, the manufacturing yield of the memory portion 1199 can be improved, so that the manufacturing yield of the CPU 1190 itself can also be improved.

An instruction input through the bus interface 1198 is input to the instruction decoder 1193 and decoded, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates a signal for controlling the operation of the ALU 1191. While a program is executed, the interrupt controller 1194 judges an interrupt request from an external input/output device or a peripheral circuit on the basis of its priority or a mask state, and processes the request. The register controller 1197 generates the address of the register 1196, and reads/writes data from/to the register 1196 in accordance with the state of the CPU 1190.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1 input from the outside, and supplies the internal clock signal CLK2 to the circuits in the CPU 1190 as illustrated in FIG. 7.

Note that FIG. 7 is just an example of the simplified CPU structure, and an actual CPU has various structures depending on the usage. For example, the CPU may have a structure in which a circuit group of an arithmetic circuit, a register, and the like is considered as one core, a plurality of cores are included, and the cores operate in parallel.

<Wireless Chip>

As illustrated in FIG. 8, a wireless chip 1200 includes an antenna 1204, a rectifier circuit 1205, a constant voltage circuit 1206, a demodulation circuit 1207, a modulation circuit 1208, a logic portion 1209, and a memory portion 1210. Note that these circuits can be chosen as appropriate depending on the usage.

The circuits of the wireless chip 1200 are included in one IC chip. The storage device in Embodiment 2 can be used as the memory portion 1210. Thus, the manufacturing yield of the memory portion 1210 is improved, so that the manufacturing yield of the wireless chip 1200 itself can be improved.

The antenna 1204 transmits and receives a radio signal 1203 to and from an antenna 1202 that is connected to a communication device 1201. Data transmission methods are roughly classified into the following three methods: an electromagnetic coupling method in which a pair of coils is provided to face each other and communicates with each other by mutual induction, an electromagnetic induction method in which communication is performed using an induction field, and a radio wave method in which communication is performed using a radio wave. Any of these methods can be used in the wireless chip 1200. The rectifier circuit 1205 generates an input potential by rectification, for example, half-wave voltage doubler rectification of an input alternating signal generated by reception of a radio signal in the antenna 1204 and smoothing of the rectified signal with a capacitor provided in a subsequent stage. Note that a limiter circuit may be provided on an input side or an output side of the rectifier circuit 1205. The limiter circuit controls power so that power that is higher than or equal to certain power is not input to a circuit in a subsequent stage if the amplitude of the input alternating signal is high and internal generation voltage is high.

The constant voltage circuit 1206 generates power supply voltage from a signal input from the rectifier circuit 1205 and supplies the power supply voltage to an internal circuit. Note that the constant voltage circuit 1206 may include a reset signal generation circuit. The reset signal generation circuit generates a reset signal of the logic portion 1209 by utilizing the rise of the power supply voltage.

The demodulation circuit 1207 demodulates the input alternating signal by envelope detection and generates a demodulated signal. The modulation circuit 1208 performs modulation in accordance with data output from the antenna 1204.

The logic portion 1209 analyzes and processes the demodulated signal. The memory portion 1210 writes or reads data in response to an access request from the logic portion 1209. The memory portion 1210 stores, for example, data on an identification number (ID).

FIGS. 9A to 9F illustrate usage examples of a wireless chip. Here, the wireless chip is used as an RFID tag that manages individual information of products and the like, for example.

An RFID tag 4000 can be used in a wide variety of fields. For example, the RFID tag 4000 can be provided in objects such as bills, coins, securities, bearer bonds, documents (e.g., driver's licenses or resident's cards, see FIG. 9A), packaging containers (e.g., wrapping paper or bottles, see FIG. 9C), recording media (e.g., DVD software or video tapes, see FIG. 9B), vehicles (e.g., bicycles, see FIG. 9D), personal belongings (e.g., bags or glasses), foods, plants, animals, human bodies, clothing, household goods, medical supplies such as medicine and chemicals, and electronic devices (e.g., liquid crystal display devices, EL display devices, smartphones, cellular phones, clocks, or watches), or tags on objects (see FIGS. 9E and 9F).

The RFID tag 4000 can be fixed to a product by being attached to a surface of the product or embedded in the product. For example, the RFID tag 4000 may be fixed to a product by being embedded in paper of a book or embedded in an organic resin of a package. The RFID tag 4000 is small, thin, and lightweight, so that the design of a product is not impaired even after the RFID tag 4000 is fixed to the product. When the RFID tag 4000 is provided in bills, coins, securities, bearer bonds, documents, or the like, an authentication function can be provided. The use of the authentication function can prevent forgery. Furthermore, when the RFID tag 4000 is attached to packaging containers, recording media, personal belongings, foods, clothing, household goods, electronic devices, or the like, a system such as an inspection system or an inventory management system can be used efficiently. When the RFID tag 4000 is attached to vehicles, the level of security can be raised.

<Electronic Device and the Like>

Examples of an electronic device (or electrical equipment) including a processor and/or a storage device are display devices, personal computers, and image reproducing devices provided with recording media (devices that read image data of recording media such as digital versatile discs (DVD) and have displays for displaying images). Other examples are cellular phones, game machines including portable game machines, portable information terminals, e-book readers, cameras (e.g., video cameras and digital still cameras), wearable displays (e.g., head mounted displays, goggle-type displays, glasses-type displays, and watch-type displays), navigation systems, audio reproducing devices (e.g., car audio systems and digital audio players), copiers, facsimiles, printers, multifunction printers, and home appliances such as refrigerator-freezers and washing machines. The processor and the storage device are semiconductor devices used for devices in various fields, and are also used in industrial machines such as semiconductor manufacturing equipment and industrial robots, transportation means such as motor vehicles, trains, ships, and aircraft, and the like. FIGS. 10A to 10F illustrate examples of devices each including a processor and/or a storage device.

Figure 10A:
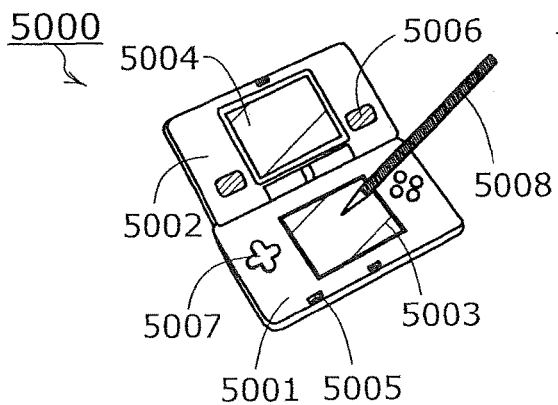

FIG. 10A is an external view illustrating a structure example of a portable game machine. A portable game machine 5000 includes a housing 5001, a housing 5002, a display portion 5003, a display portion 5004, a microphone 5005, a speaker 5006, an operation key 5007, a stylus 5008, and the like.

Figure 10B:
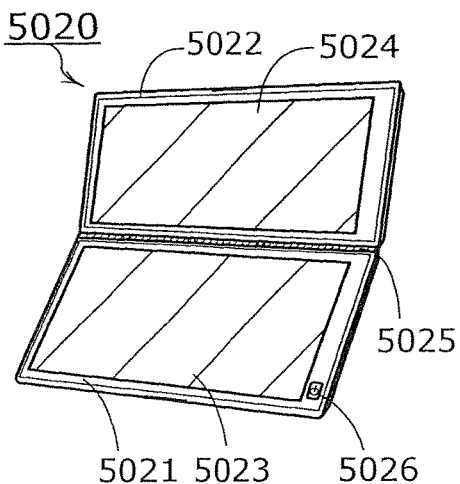

FIG. 10B is an external view illustrating a structure example of a portable information terminal. A portable information terminal 5020 includes a housing 5021, a housing 5022, a display portion 5023, a display portion 5024, a joint 5025, an operation key 5026, and the like. The display portion 5023 is provided in the housing 5021, and the display portion 5024 is provided in the housing 5022. The housings 5021 and 5022 are connected to each other with the joint 5025, and an angle between the housings 5021 and 5022 can be changed with the joint 5025. An image on the display portion 5023 may be switched depending on the angle between the housings 5021 and 5022 at the joint 5025. A display device with a position input function may be used as either one or both the display portions 5023 and 5024. For example, the position input function can be added to a display device by providing a touch panel in the display device or by providing a photoelectric conversion element called a photosensor in a pixel portion of the display device.

Figure 10C:
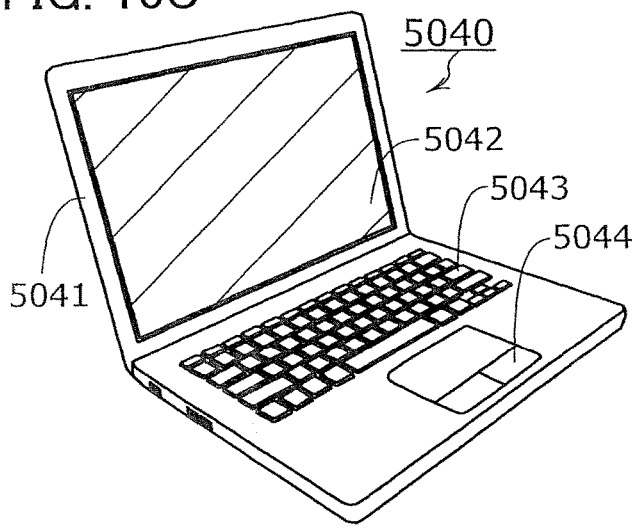

FIG. 10C is an external view illustrating a structure example of a laptop. A laptop 5040 includes a housing 5041, a display portion 5042, a keyboard 5043, a pointing device 5044, and the like.

Figure 10D:
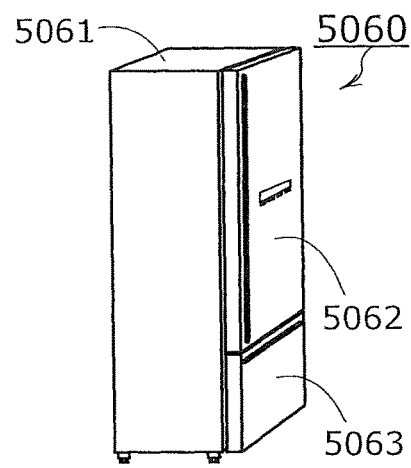

FIG. 10D is an external view illustrating a structure example of an electric refrigerator-freezer. An electric refrigerator-freezer 5060 includes a housing 5061, a refrigerator door 5062, a freezer door 5063, and the like.

Figure 10E:
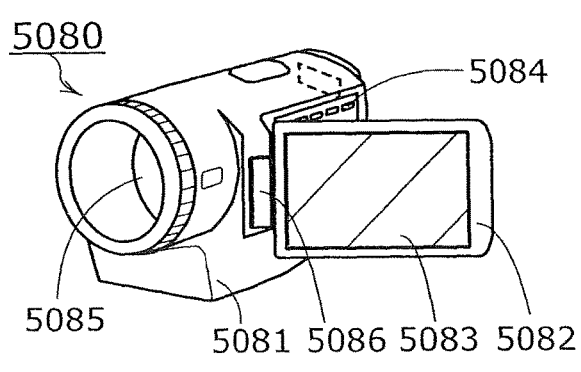

FIG. 10E is an external view illustrating a structure example of a video camera. A video camera 5080 includes a housing 5081, a housing 5082, a display portion 5083, operation keys 5084, a lens 5085, a joint 5086, and the like. The operation keys 5084 and the lens 5085 are provided in the housing 5081, and the display portion 5083 is provided in the housing 5082. The housings 5081 and 5082 are connected to each other with the joint 5086, and an angle between the housings 5081 and 5082 can be changed with the joint 5086. The direction of an image on the display portion 5083 may be changed and display and non-display of an image may be switched depending on the angle between the housings 5081 and 5082.

Figure 10F:
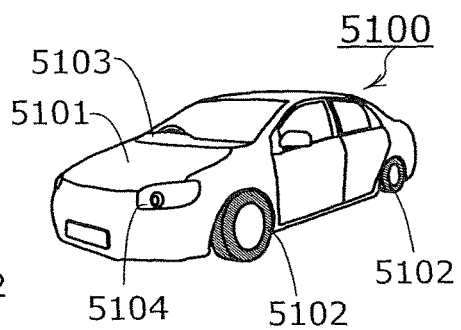

FIG. 10F is an external view illustrating a structure example of a motor vehicle. A motor vehicle 5100 includes a car body 5101, wheels 5102, a dashboard 5103, lights 5104, and the like.

This application is based on Japanese Patent Application serial No. 2013-228081 filed with Japan Patent Office on Nov. 1, 2013, the entire contents of which are hereby incorporated by reference.

What is claimed is:
1. A CPU comprising:
    a storage device, the storage device comprising:
        first and second programmable logic elements each comprising:
            a first logic circuit;
            a second logic circuit;
            a first configuration memory;
            a second configuration memory;
            a programmable look-up table;
            a register; and
            a multiplexer,
    wherein an output of the first configuration memory is electrically connected to an input of the first logic circuit,
    wherein an output of the second configuration memory is electrically connected to an input of the second logic circuit,
    wherein data output from an output of the first logic circuit is input to a first input of the programmable look-up table,
    wherein data output from an output of the second logic circuit is input to a second input of the programmable look-up table,
    wherein the register is configured to store data output from the programmable look-up table,
    wherein the multiplexer is configured to select and output data output from the programmable look-up table or data output from the register, and
    wherein the first and second logic circuits are exclusive-NOR circuits.
2. The CPU according to claim 1,
    wherein the first logic circuit is configured to perform an operation of an exclusive-NOR of first data and first configuration data output from the first configuration memory and output an operation result as third data,
    wherein the second logic circuit is configured to perform an operation of an exclusive-NOR of second data and second configuration data output from the second configuration memory, and output an operation result as fourth data, and wherein the programmable look-up table is configured to perform a logical operation of the third and fourth data and fifth data and output an operation result as sixth data.

3. The CPU according to claim 2,
wherein the sixth data output from the programmable look-up table of the first programmable logic element is configured to be input as the fifth data of the programmable look-up table of the second programmable logic element.

4. The CPU according claim 1,
wherein a CPU core, a memory interface, a bus interface, and the storage device are included in an IC chip.

5. A CPU comprising:
a storage device, the storage device comprising:
  first and second programmable logic elements each comprising:
    a first logic circuit;
    a second logic circuit;
    a third logic circuit;
    a first configuration memory;
    a second configuration memory;
    a programmable look-up table;
    a register; and
    a multiplexer,
  wherein an output of the first configuration memory is electrically connected to an input of the first logic circuit,
  wherein an output of the second configuration memory is electrically connected to an input of the second logic circuit,
  wherein data output from an output of the first logic circuit is input to a first input of the programmable look-up table and a first input of the third logic circuit,
  wherein data output from an output of the second logic circuit is input to a second input of the programmable look-up table and a second input of the third logic circuit,
  wherein the register is configured to store data output from the programmable look-up table,
  wherein the multiplexer is configured to select and output data output from the programmable look-up table or data output from the register,
  wherein the first and second logic circuits are exclusive-NOR circuits, and
  wherein the third logic circuit is an AND circuit.

6. The CPU according to claim 5,
wherein the first logic circuit is configured to perform an operation of an exclusive-NOR of first data and first configuration data output from the first configuration memory and output an operation result as third data,
wherein the second logic circuit is configured to perform an operation of an exclusive-NOR of second data and second configuration data output from the second configuration memory, and output an operation result as fourth data,
wherein the third logic circuit is configured to perform a logical operation of the third and fourth data and fifth data and output an operation result as sixth data, and
wherein the third and fourth data are configured to be input to the programmable look-up table.

7. The CPU according to claim 6,
wherein the sixth data output from the third logic circuit of the first programmable logic element is configured to be input as the fifth data of the third logic circuit of the second programmable logic element.

8. The CPU according claim 5,
wherein a CPU core, a memory interface, a bus interface, and the storage device are included in an IC chip.

9. A CPU comprising:
a storage device, the storage device comprising:
  a memory portion comprising a memory cell array comprising a plurality of memory cells;
  a redundant circuit; and
  first and second programmable logic elements,
wherein the memory portion comprises:
  the memory cell array where the plurality of memory cells are arranged; and
  a peripheral circuit configured to select at least one of the memory cells specified by a logical address and to read and write data,
wherein the memory cell array comprises:
  a first storage area including $2^n$ blocks, where n is an integer of one or more; and
  a second storage area including m redundant blocks, where m is an integer, $1 \leq m < 2^n$, to be substituted for defective blocks where defective memory cells exit in the first storage area,
wherein first and second programmable logic elements each comprising:
  a first logic circuit;
  a second logic circuit;
  a first configuration memory;
  a second configuration memory;
  a programmable look-up table;
  a register; and
  a multiplexer,
wherein higher-order m bits are configured to function as redundant addresses in physical addresses of the first and second storage areas,
wherein physical addresses of the $2^n$ blocks each have a structure where a redundant address is added to a higher-order bit of the logical address,
wherein redundant addresses of the $2^n$ blocks are the same,
wherein an output of the first configuration memory is electrically connected to an input of the first logic circuit,
wherein an output of the second configuration memory is electrically connected to an input of the second logic circuit, wherein data output from an output of the first logic circuit is input to a first input of the programmable look-up table,
wherein data output from an output of the second logic circuit is input to a second input of the programmable look-up table, and
wherein the first and second logic circuits are exclusive-NOR circuits.

10. The CPU according to claim 9,
wherein redundant addresses of the m redundant blocks are different from each other and different from a redundant address of the first storage area,
wherein the redundant circuit includes a memory configured to store a logical address of the defective block in the first storage area and generates the redundant address from a logical address stored in the memory and a logical address of the second storage area the access of which is requested, and
wherein when a redundant address generated in the redundant circuit agrees with any of the redundant addresses of the m redundant blocks, the peripheral circuit is configured to select the redundant block.

11. The CPU according to claim 10,
wherein the redundant circuit is reconfigurable to produce data for testing the memory portion,
wherein when the first storage area is tested, the redundant circuit outputs at least a logical address of the block to be tested to the peripheral circuit as test data, and
wherein when the second storage area is tested, the redundant circuit outputs the redundant address of the redundant block to the peripheral circuit as test data.

12. The CPU according to claim 10, wherein the redundant circuit is a reconfigurable circuit comprising:
first and second programmable logic element elements each comprising:
a first logic circuit;
a second logic circuit;
a first configuration memory;
a second configuration memory;
a programmable look-up table;
a register; and
a multiplexer,
wherein the register is configured to store data output from the programmable look-up table,
wherein the multiplexer is configured to select and output data output from the programmable look-up table or data output from the register,
wherein the first logic circuit is configured to perform an operation of an exclusive-NOR of first data and first configuration data output from the first configuration memory and output an operation result as third data,
wherein the second logic circuit is configured to perform an operation of an exclusive-NOR of second data and second configuration data output from the second configuration memory, and output an operation result as fourth data, and
wherein the programmable look-up table is configured to perform a logical operation of the third and fourth data and fifth data and output an operation result as sixth data.

13. The CPU according claim 9,
wherein a CPU core, a memory interface, a bus interface, and the storage device are included in an IC chip.

* * * * *